US 6,675,987 B2

(12) United States Patent
Soberunie et al.

(10) Patent No.: US 6,675,987 B2
(45) Date of Patent: Jan. 13, 2004

(54) CHEMICAL DELIVERY SYSTEMS AND METHODS OF DELIVERY

(75) Inventors: David Soberunie, Tracy, CA (US); Randy Forshey, Tracy, CA (US)

(73) Assignee: The Boc Group, Inc., Murray Hill, NJ (US)

( * ) Notice: Subject to any disclaimer, the term of this patent is extended or adjusted under 35 U.S.C. 154(b) by 0 days.

(21) Appl. No.: 09/968,566

(22) Filed: Sep. 29, 2001

(65) Prior Publication Data

US 2002/0017534 A1 Feb. 14, 2002

Related U.S. Application Data

(63) Continuation of application No. 09/870,227, filed on May 30, 2001, now Pat. No. 6,340,098, which is a continuation of application No. 09/568,926, filed on Feb. 13, 2001, now Pat. No. 6,269,975, which is a division of application No. 09/224,607, filed on Dec. 31, 1998, now Pat. No. 6,098,843, which is a continuation of application No. 09/222,003, filed on Dec. 30, 1998, now abandoned.

(51) Int. Cl.[7] .................................................. B67D 5/08
(52) U.S. Cl. ......................... 222/53; 222/56; 222/129; 222/145.5; 222/145.6
(58) Field of Search ................................ 137/403, 408; 222/1, 53, 56, 58, 145.1, 145.5, 145.6

(56) References Cited

U.S. PATENT DOCUMENTS

| | | | |
|---|---|---|---|
| 3,051,192 A | 8/1962 | Fagot et al. ................ 137/391 |
| 3,237,816 A | 3/1966 | Anderson .................... 222/450 |
| 3,930,258 A | 12/1975 | Dick et al. .................... 346/75 |
| 4,132,242 A | 1/1979 | Carroll, Jr. .................... 137/263 |
| 4,524,801 A | 6/1985 | Magnasco et al. ........ 222/56 X |
| 4,601,409 A | 7/1986 | Diregolo ......................... 222/1 |
| 4,830,508 A | 5/1989 | Higuchi et al. ........... 222/56 X |
| 5,086,435 A | 2/1992 | Studenberg .................... 141/83 |
| 5,293,893 A | 3/1994 | O'Dougherty .............. 137/113 |
| 5,316,181 A | 5/1994 | Burch .......................... 222/61 |
| 5,383,574 A | 1/1995 | Ralphael ........................ 222/1 |
| 5,479,959 A | 1/1996 | Stotelmyer et al. ......... 137/559 |
| 5,490,611 A | 2/1996 | Bernosky et al. ......... 222/56 X |
| 5,490,809 A | 2/1996 | Jones et al. .................... 451/60 |
| 5,558,435 A | 9/1996 | Marjo ........................ 366/141 |
| 5,584,416 A | 12/1996 | Florian .......................... 222/1 |
| 5,632,411 A | 5/1997 | Harty et al. .................... 222/1 |
| 5,636,762 A | 6/1997 | Juhola et al. .................. 222/1 |
| 5,700,401 A | 12/1997 | Weinberg et al. ............. 261/27 |
| 5,713,492 A | 2/1998 | DeGennaro ................. 222/153 |
| 5,753,868 A | 5/1998 | Diem ....................... 222/57 X |
| 5,826,748 A | 10/1998 | Qian et al. ...................... 222/1 |
| 6,098,843 A * | 8/2000 | Soberanis et al. ............. 222/53 |
| 6,269,975 B2 * | 8/2001 | Soberanis et al. ............. 222/1 |
| 6,340,098 B2 * | 1/2002 | Soberanis et al. ....... 222/145.6 |

* cited by examiner

*Primary Examiner*—Kenneth Bomberg
(74) *Attorney, Agent, or Firm*—Robert Moll

(57) ABSTRACT

The present invention relates to chemical delivery systems and methods for delivery of liquid chemicals. In one embodiment, the present invention relate to systems having multi-reservoir load cell assemblies for delivering chemicals used in the semiconductor industry. In one embodiment, the present invention provides a multi-reservoir load cell assembly, including a controller, a buffer reservoir, a main reservoir, one or more load cells, coupled to the assembly and to the controller, operable to weigh the liquid in the reservoir(s), a plurality of supply lines, each supply line having a valve and connecting one of the supply containers to the main reservoir, and a gas and vacuum sources for withdrawing the liquid from the assembly when demanded by the controller and for refilling the assembly from the supply containers.

4 Claims, 11 Drawing Sheets

CHEMICAL DELIVERY SYSTEMS AND METHODS OF DELIVERY

This application is a continuation of U.S. application Ser. No. 09/870,227, filed on May 30, 2001, now U.S. Pat. No. 6,340,098 B2, which is a continuation of U.S. application Ser. No. 09/568,926, filed on Feb. 13, 2001, now U.S. Pat. No. 6,269,975, which is a continuing prosecution application of U.S. application Ser. No. 09/568,926, filed on May 10, 2000, now abandoned, which is a divisional of U.S. application Ser. No. 09/224,607, filed on Dec. 31, 1998, now U.S. Pat. No. 6,098,843, which is a continuation of U.S. application Ser. No. 09/222,003, filed on Dec. 30, 1998, now abandoned. This application incorporates by reference each application and patent listed above.

BACKGROUND

The present invention relate generally to systems and methods for delivering of liquid chemicals, and more particularly, to systems and methods for delivery of liquid chemicals in precise amounts using logic devices and multi-reservoir load cell assemblies.

The present invention has many applications, but may be best explained by considering the problem of how to deliver photoresist to silicon wafers for exposure of the photoresist in the process of photolithography. To form the precise images required, the photoresist must be delivered in precise amounts on demand, be free of bubbles, and be of precise uniform thickness on the usable part of the wafer. The conventional systems have problems as discussed below.

As shown in FIG. 1, a representative conventional photoresist delivery system includes supply containers 100, 102, typically bottles, which supply photoresist to a single-reservoir 104 by line 117, which is connected to supply lines 106, 108 monitored by bubble sensors 110, 112 and controlled by valves V1 and V2. The bottom of the reservoir is connected to a photoresist output line 114 to a track tool (not shown) which dispenses photoresist on the wafer. The space above the photoresist in the reservoir 104 is connected to a gas line 118 which, based on position of a three way valve V3, either supplies nitrogen gas to the reservoir 104 from a nitrogen manifold line 126, regulated by needle valve 1, or produces a vacuum in the reservoir 104. To sense the level of the photoresist in the reservoir 104, the system employs an array of capacitive sensors 122 arranged vertically on the walls of the reservoir. 104. A two-way valve V4, located between the nitrogen gas manifold and the inlet of a vacuum ejector 124, supplies or acts off flow of nitrogen to the vacuum ejector 124.

The photoresist delivery system must be "on-line" at all times so the track tool can dispense the photoresist as required. Many of the photoresist delivery systems attempt to use the reservoir to provide an on-line supply of photoresist to the track tool, but the photoresist delivery system must still refill the reservoir on a regular basis which is dependent on timely replacement of empty supply containers. Otherwise, the track tool will still fail to deliver the photoresist when demanded.

During dispense mode, when photoresist is withdrawn by the track tool from the reservoir 104, the valve V3 permits the nitrogen to flow from the nitrogen manifold to the reservoir 104 to produce a nitrogen blanket over the photoresist to reduce contamination and to prevent a vacuum from forming as the photoresist level drops in the reservoir. Once the photoresist in the reservoir 104 reaches a sufficiently low level the system controller (not shown) initiates refill mode, where a set of problems arise.

During refill mode, the valve V4 is activated so that nitrogen flows from the manifold line 126 to the vacuum ejector 124 which produces a low pressure line 170 thereby producing a low pressure space above the photoresist in the reservoir 104. The bubble sensors 110, 112 monitor for bubbles in the supply lines 106, 108, presumed to develop when the supply containers 100, 102, become empty. If, for example, the bubble sensor 110 detect a bubble, the controller turns off the valve V1 to supply container 100 and the valve V2 opens to supply container 102 to continue refilling the reservoir 104. However, bubbles in the supply line 106 may not mean supply container 100 is empty. Thus, not all of the photoresist in supply container 100 may be used before the system switches to the supply container 102 for photoresist. Thus, although the conventional system is intended to allow multiple supply containers to replenish the reservoir when needed, the system may indicate at a supply container is empty and needs to be replaced before necessary.

If the supply container 100 becomes empty and the operator fails to replace it and the system continues to operate until the supply container 102 also becomes empty, the reservoir 104 will reach a critical low level condition. If this continues, bubbles may be arise due to photoresist's high susceptibility to bubbles; if a bubble, however minute, enters the photoresist delivered to the wafer, an imperfect image may be formed in the photolithography process.

Further, if the pump of the track tool, connected downstream of the chemical output line 114, turns on when the reservoir is refilling, the pump will experience negative pressure from the vacuum in the single-reservoir pulling against the pump. Several things can happen if this persists: the lack of photoresist delivered to the track tool may send a false signal that the supply containers are empty, the pump can fail to deliver photoresist to its own internal chambers, lose its prime and ability to adequately dispense photoresist, and the pump can even overheat and burn out. The result of each scenario will be the track tool receives insufficient or even no photoresist, known as a "missed shot," which impacts the yield of the track tool.

The present invention addresses these problems as well as avoids waste of expensive photoresist, provides a friendly user interface depicting the amount of photoresist remaining in the supply containers, and reduces system capital and operating costs. If, for example, the amount of photoresist in the supply containers cannot be seen, the present invention permits the interface to be provided at a distance by conventional computer network capabilities and the electronics provided.

SUMMARY OF THE INVENTION

The present invention relates to systems using controllers or logic devices and multi-reservoir load cell assemblies for precision delivery of liquid chemicals. It also relate to methods of delivering liquid chemicals from supply sources to processes such that the present invention accurately accounts and adjusts for the dynamic supply and use of the liquid chemical to meet process requirements. Finally, the present invention provides multi-reservoir load cell assemblies for monitoring, regulating, and analyzing the liquid supply available to a process.

DETAILED DESCRIPTION OF THE PREFERRED EMBODIMENTS

Figure 1:
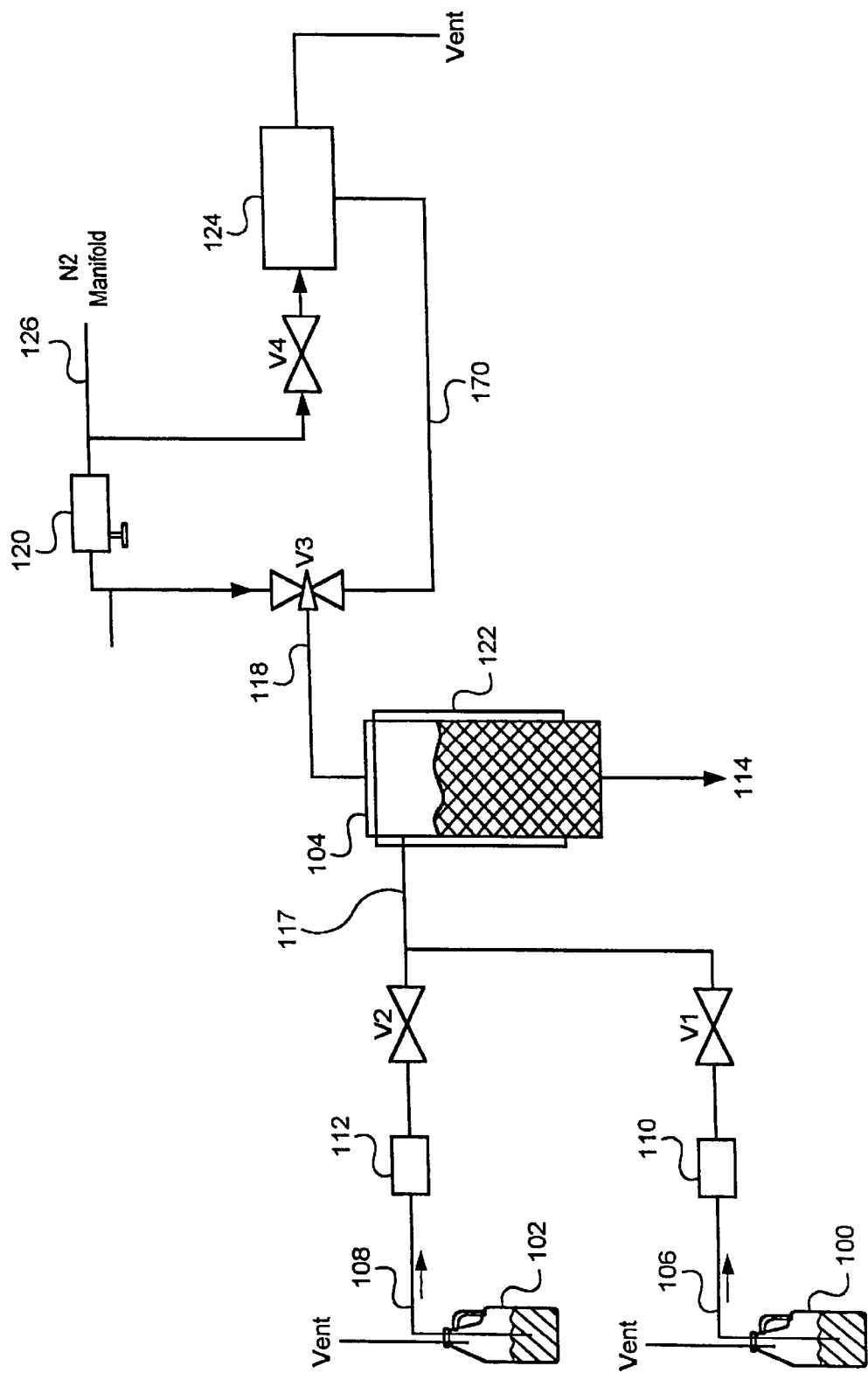
FIG. 1 illustrates a chemical delivery system using a single-reservoir and bubble sensors on the supply lines leading to the single-reservoir.
Figure 2B:
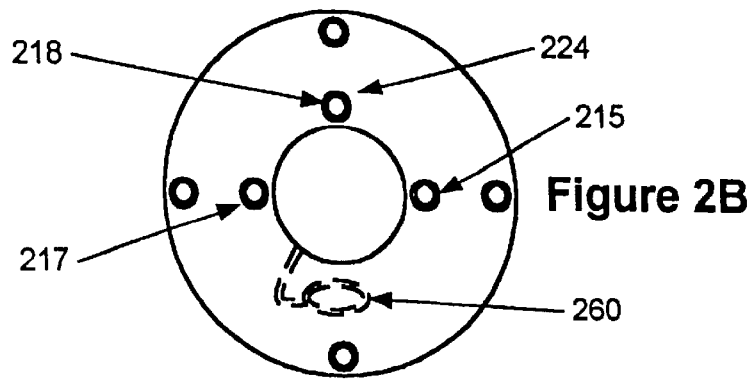
FIG. 2B is a top view of the first embodiment of the multi-reservoir load cell assembly.
Figure 2A:
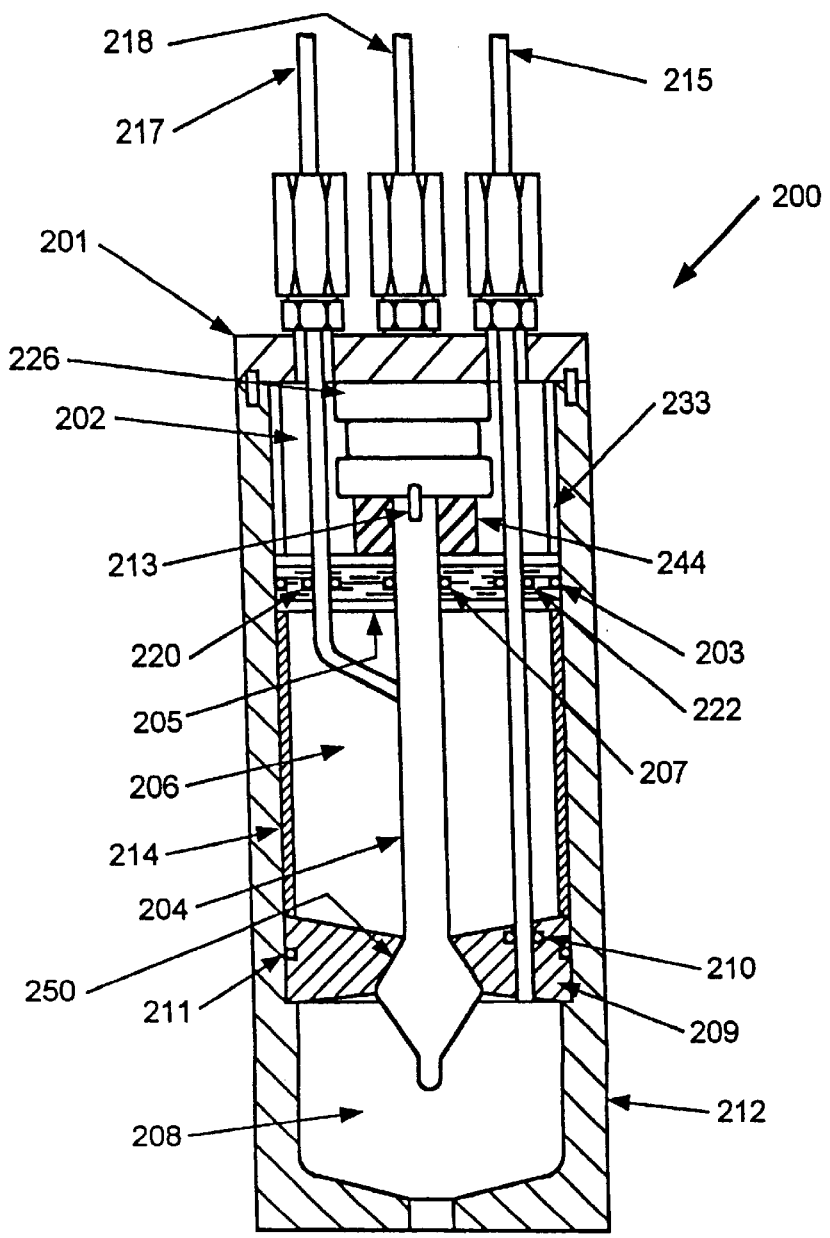
FIG. 2A is a front cross-section of a first embodiment of the multi-reservoir load cell assembly of the present invention.

In the first embodiment, the present invention includes a multi-reservoir load cell assembly 200 as shown in FIGS. 2A–2B. The assembly 200 can be part of the system shown in FIG. 3, and can replace the problematic single-reservoir 104 and bubble sensors 110, 112 of FIG. 1.

In this embodiment, the assembly 200, constructed of Teflon, SST or any chemical compatible material, includes an upper compartment 202, a main reservoir 206, and a buffer reservoir 208, all in an outer housing 212. The buffer reservoir 208 is sealed from the main reservoir 206 by a separator 209, and an o-ring seal 211 seals the perimeter of the separator 209 to the outer housing 212. The separator 209 uses a center conical hole 250 that allows an internal sealing shaft 204 to form a liquid and gas-tight seal with the separator 209. The separator 209 forms a liquid and gas-tight seal to the pneumatic tube 215 with an owing seal 210. The main reservoir 206 contains a middle sleeve 214 that forms a rigid separation between the separator 209 and the reservoir cap 205. The perimeter of reservoir cap 205 seals against the internal surface of the outer housing 212 with the use of an o-ring 203. The reservoir cap 205 seals against the internal sealing shaft 204, the chemical input tube 217, and the pneumatic tubes 215 and 218 with a set of o-ring seals 207, 220, 222, and 224 (hidden, but location shown in FIG. 2B), respectively. Mounted to the reservoir cap 205 is a spacer 244 which also mounts to the pneumatic cylinder 226. The reservoir cap 205 is held in position by the upper sleeve 233 and the middle sleeve 214. The outer Teflon reservoir top 201 is bolted to the outer housing 212 and forms a mechanical hard stop for the upper sleeve 233 and the pneumatic cylinder 226. Pneumatic air lines for the pneumatic cylinder 226 penetrate the outer Teflon reservoir top 201 through the clearance hole 260.

It should be clear that the present invention is not limited to the delivery of photoresist on silicon wafers. For example, although the invention shows advantages over the conventional system in this environment, the systems of the present invention can deliver other liquid chemicals for other types of processes, such as the delivery of developer or chemical mechanical polishing slurries. Because the novelty of the present invention extends beyond the nature of the chemical being delivered, the following description refers to the delivery of chemicals to avoid a misunderstanding regarding the scope of the invention.

Figure 3:
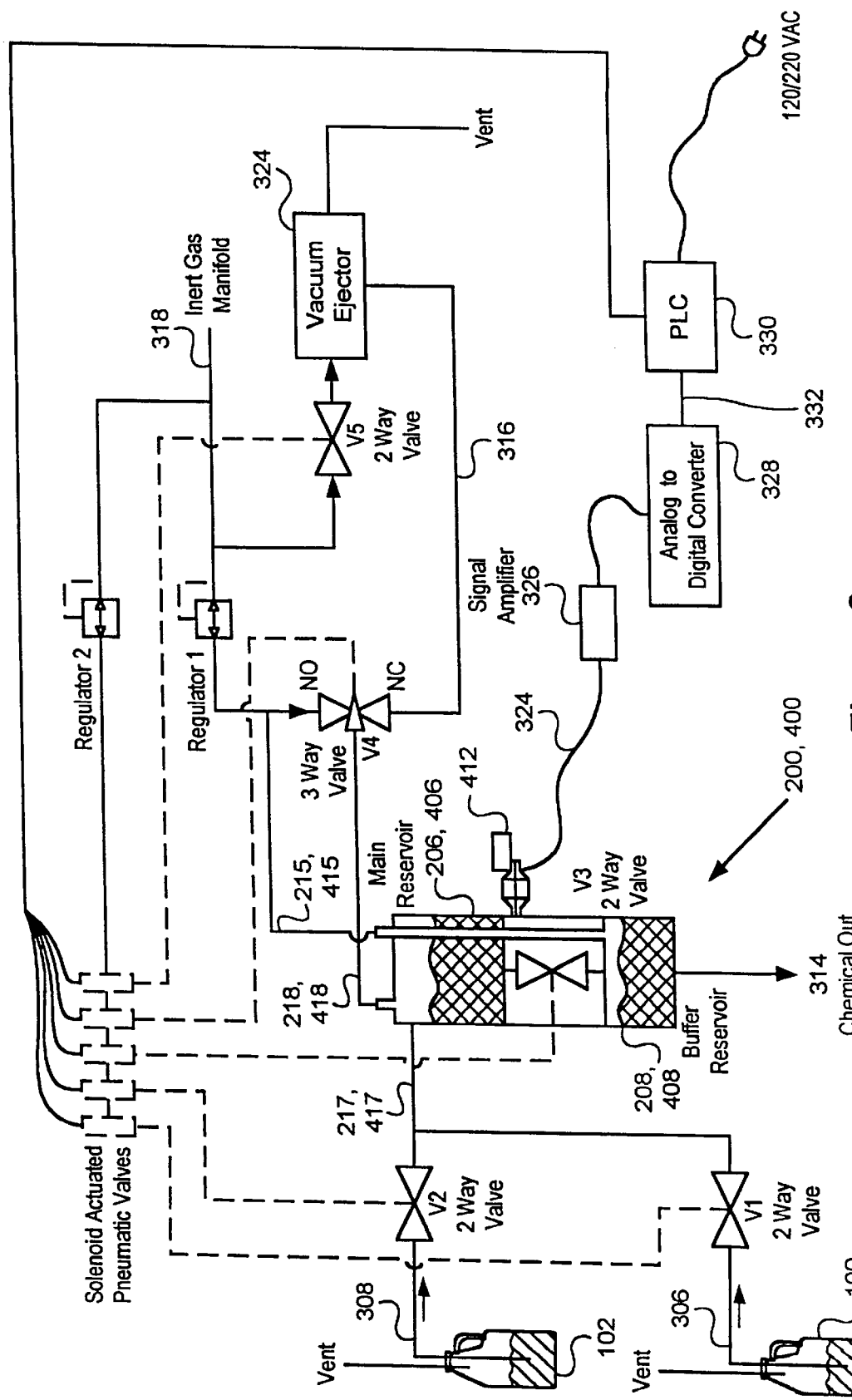
FIG. 3, a piping and instrument diagram, illustrates embodiments of the chemical delivery system including the multi-reservoir load cell assemblies of FIGS. 2A–2B or 4A–4B.

As shown in FIG. 3, the multi-reservoir load cell assembly 200 shown in FIGS. 2A–2B is suspended on and weighed by a load cell 412, preferably such as a Scaime load cell model no. F60X10C610E and a programmable logic controller (PLC) 330, preferably such as the Mitsubishi FX2N, a computer, or another conventional logic device determines the volume of the chemical in the assembly 200 from the load cell weight and the specific gravity of the chemical. As chemical from line 217 is drawn into the main reservoir 206, the load cell 412 outputs a small mV analog signal 324 proportional to the weight on the load cell 412. In one embodiment, an ATX-1000 signal amplifier 326 boosts the small signal 324 to the 4–20 millivolt range and sends it to an analog-to-digital converter 328, such as the Mitsubishi FX2N4-AD, and the output digital signal 332 is sent to the PLC 330. The PLC 330 can be rapidly programmed by conventional ladder logic. During withdrawal of the chemical, the weight of the assembly 200 decreases until the software set point of the PLC 330 is reached.

As further shown in FIG. 3, the PLC 330 may control valves V1–V5 using 24 DC Volt solenoid actuated valves, and activate them by an output card such as the Mitsubishi FXPN. Each solenoid valve, when opened, allows pressurized gas from regulator 2 such as a VeriFlow self-relieving regulator, to the pneumatically operated valves V1–V5 to open or close the valves. The sequence of operation of the first embodiment is programed in the PLC 330 so the components shown in FIGS. 2A–2B and 3 work as described below.

Once the chemical drops to a certain level, the PLC 330 triggers the system shown in FIG. 3 to begin an automatic refill sequence using the multi-reservoir load cell assembly 200 of FIGS. 2A–2B as follows:

a) A blanket of preferably low pressure, e.g., one psi inert gas is continuously supplied by the regulator 1, such as a Veriflow self-relieving regulator, to the main reservoir 206 by the pneumatic tube 218.

b) The internal sealing shaft 204 is lifted by the pneumatic cylinder 226, thereby sealing the buffer reservoir 208 from the main reservoir 206.

c) Once the buffer reservoir 208 is sealed, the main reservoir 206 is evacuated to a vacuum of approximately 28 inches of mercury. As shown in FIGS. 2A–2B, the pneumatic tube 218 from the main reservoir 206 connects to the output side of a three-way valve V4. Valve V4 is actuated so that the tube 218 communicates with the line 316 connected to the vacuum ejector 324 as shown in FIG. 3. The vacuum ejector 324 is powered by compressed gas which is directed to it by the two-way valve V5. Once valve V5 is on, it allows compressed gas to pass through and the vacuum ejector 324 develops about 28 inches of mercury (vacuum) through the line 316 communicating with the main reservoir 206.

d) The vacuum is isolated from the buffer reservoir 208 which has an inert gas slight blanket above it and continues to supply chemical to the process or tool without exposing the chemical being delivered to the tool to negative pressure or a difference in pressure.

e) The vacuum generated in the main reservoir 206 creates a low pressure chemical line that is connected to the valves V1 and V2. Assuming that valve V2 opens, the low pressure line 217 causes chemical from the supply container 102 to flow into the main reservoir 206. During this period of time the main reservoir 206 refills with chemical until a determined full level is achieved.

f) The full level is determined by use of the load cell 412 and weight calculations performed by the PLC 330. For example, one preferred embodiment uses a buffer reservoir 208 with a volume capacity of 439 cubic centimeters (cc) and a main reservoir 206 with a capacity of 695 cc. Using the specific gravity of the chemical, the PLC 330 calculates the volume that the chemical occupies. The PLC 330 then begins a refill sequence once the chemical volume reaches or falls below 439 cc. The refill stops once the chemical volume reaches 695 cc. This sequence allows nearly all of the 439 cc of the chemical in the buffer reservoir 208 to be consumed while refilling the main reservoir 206 with the 695 cc of chemical and prevents overflow of the main reservoir 206 or complete evacuation of chemical from the buffer reservoir 208.

g) Once the main reservoir 206 has refilled, the valve V5 is turned off; thereby stopping gas flow to and vacuum generation by the vacuum ejector 324. The thruway valve V4 is then switched so that the inert gas line 218 communicates with the main reservoir 206 and an inert gas blanket is again formed over the chemical in the main reservoir 206 at the same pressure as the buffer reservoir 208, since both lines 218, 215 receive gas from the same inert gas manifold 318 (see FIG. 3). Also, the valve V2 is closed which now isolates the supply container 102 from the main reservoir 206.

After the main reservoir 206 is full of chemical with an inert gas blanket above, the internal sealing shaft 204 is lowered and allows chemical from the main reservoir 206 to flow into the buffer reservoir 208. Eventually, the buffer reservoir 208 completely fills along with a majority of the main reservoir 206. The pneumatic tube 215 connecting the buffer reservoir 208 fills with chemical until the chemical in the tube 215 reaches the same level as the main reservoir 206, because the pressures in both reservoirs are identical. The internal sealing shaft 204 remains open until it is determined, to once again, refill the main reservoir 206.

Because the first embodiment uses load cells instead of bubble sensors for determining the amount of chemical in the supply containers, the present invention provides a number of very useful features. One can accurately determine in real-time the chemical remaining in the supply containers. If the supply containers are full when connected to the system the PLC can easily calculate the chemical removed (and added to the multi-reservoir load cell assembly) and how much chemical remains in the supply containers. This information can be used to provide a graphical representation of the remaining amount of chemical in the containers. A second feature is that the PLC can determine precisely when a supply container is completely empty by monitoring the weight gain within the system. If the weight of the reservoir does not increase during a refill sequence then the supply container is inferred to be empty. This causes the valve for the supply container to be closed and the next supply container to be brought on line. A related third feature is the load cell technology provides the ability to accurately forecast and identify the trends in chemical usage. Since the exact amount of chemical is measured coming into the reservoir the information can be easily electronically stored and manipulated and transmitted.

Figure 4A:
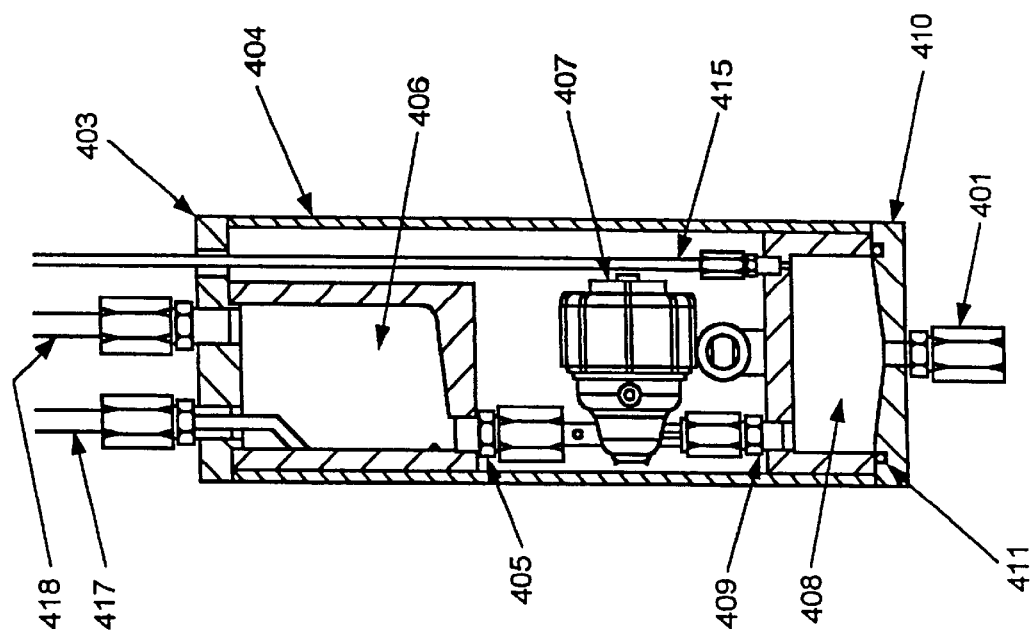
FIG. 4A is a front cross-section of a second embodiment of the multi-reservoir load cell assembly.
Figure 4B:
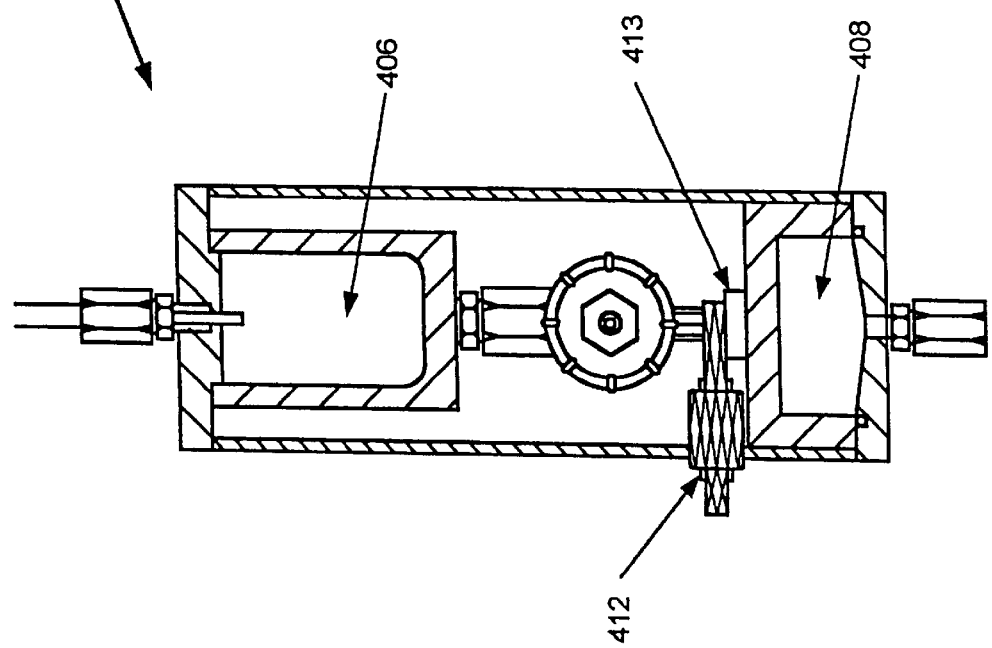
FIG. 4B is a side cross-section of the second embodiment of the multi-reservoir load cell assembly.

A second embodiment of the multi-reservoir load cell assembly 400 shown in FIGS. 4A–4B, includes a buffer reservoir 408, fastened and sealed by the o-rings 411 to the bottom cap 410. The output chemical flows through tube connection 401. Connected to the buffer reservoir 408 are a pneumatic tube 415, a chemical valve 407, a load cell separator 413, and the load cell 412. The load cell 412 is securely bolted to the buffer reservoir 408 and the other side is securely bolted to a rigid member (not shown) not part of the multi-reservoir load cell assembly 400. The outer sleeve 404 slips around the buffer reservoir 408 and rests against the bottom cap 410. The outer sleeve 404 is machined to allow the load cell 412 to pass through it unencumbered. End 405 of the valve 407 connects to the main reservoir 406 and the other end 409 connects to buffer reservoir 408. The main reservoir 406 is encapsulated and sealed, by o-rings in the upper cap 403. The upper cap 403 incorporates a stepped edge along its periphery to secure the outer sleeve 404 to it. Pneumatic line 418 and chemical input line 417 are secured to the upper cap 403. The outer sleeve 404 provides the mechanical strength for the separate reservoirs 406 and 408.

The multi-reservoir load cell assembly shown in FIGS. 4A–4B, and used in the system of FIG. 3, is similar to the first embodiment with the following notable differences:

a) Valve 407 provides control of the fluid path between the main reservoir 406 and the buffer reservoir 408.

b) The outer sleeve 404 provides the mechanical support to form the rigid assembly that supports the main reservoir 406 as well as the buffer reservoir 408.

Figures 5A, 5B:
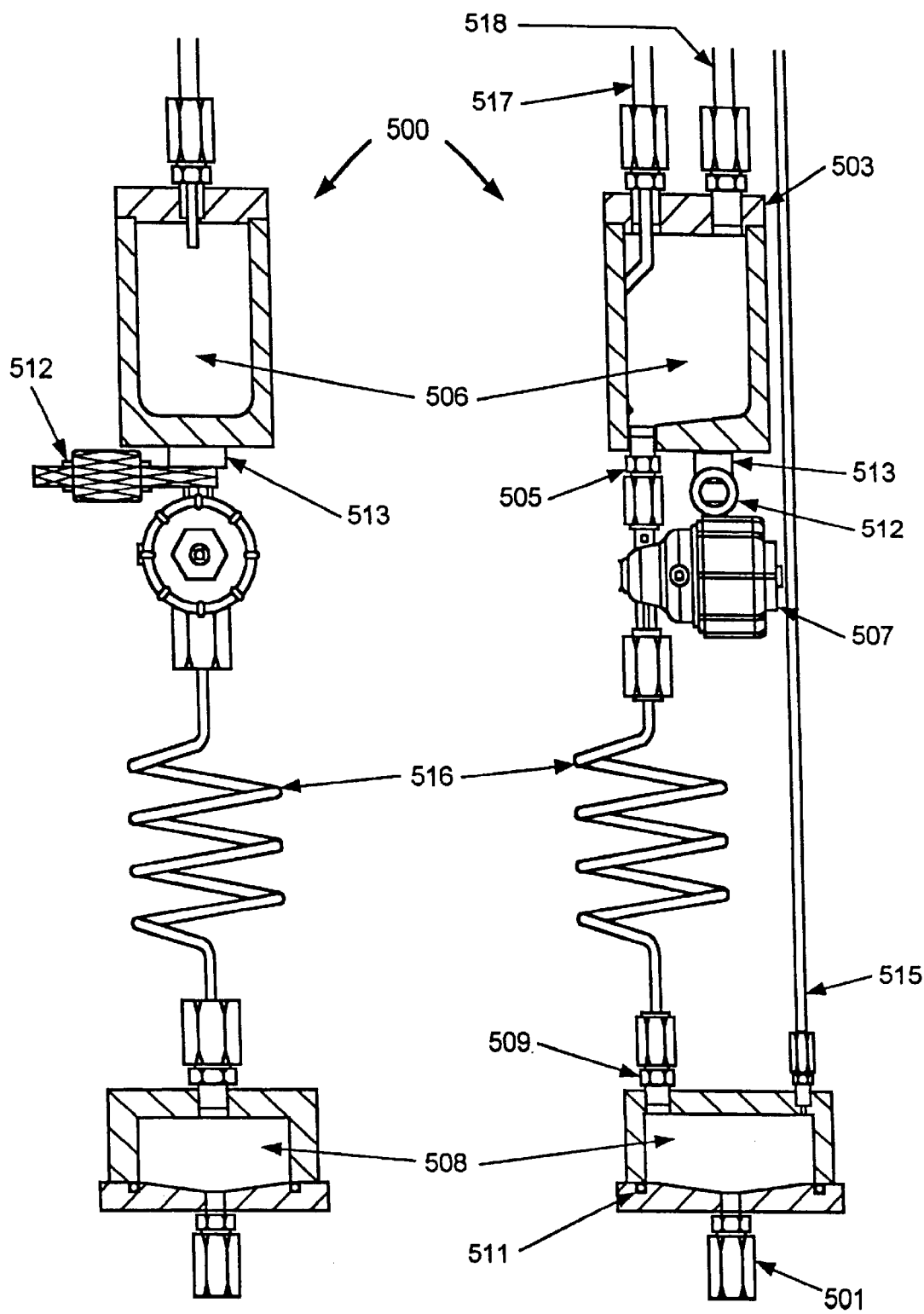
FIG. 5A is a front cross-section of a third and sixth embodiment of the multi-reservoir load cell assembly.
FIG. 5B is a side cross-section of the third and sixth embodiment of the multi-reservoir load cell assembly.

A third embodiment of the multi-reservoir load cell assembly shown in FIGS. 5A–5B, employs two reservoirs 506, 508 spaced apart from each other but connected by a flexible fluid line 516.

The third embodiment uses many of the previous components shown in FIGS. 4A–4B, except:

(i) it does not use an outer sleeve 404; (ii) the buffer reservoir 508 is not mechanically suspended from the main reservoir 506; and (iii) the load cell spacer 513 and the load cell 512 are fastened to the bottom of tee main reservoir 506.

Figure 6:
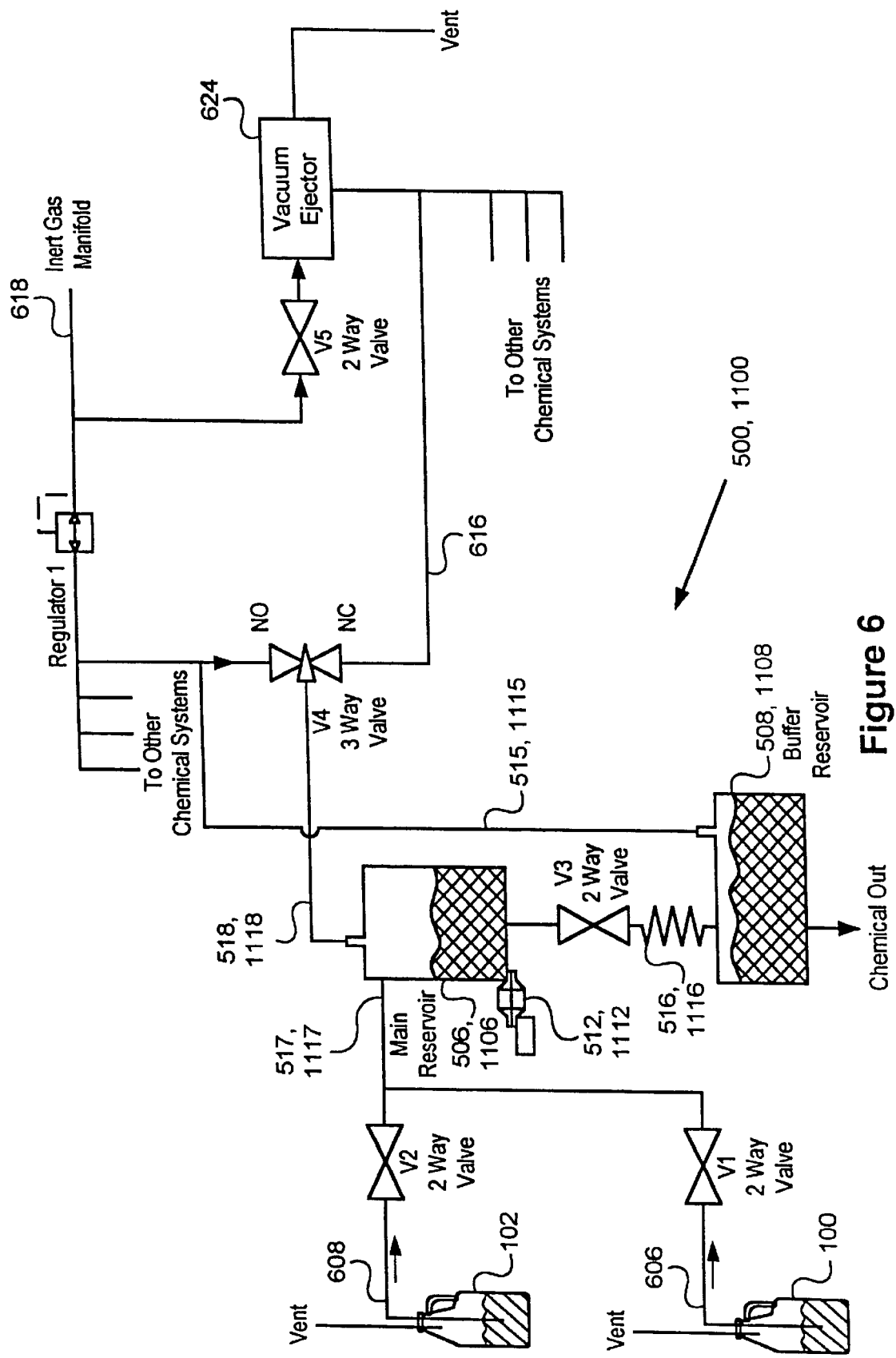
FIG. 6, a piping and instrument diagram, illustrates embodiments of the chemical delivery system including the multi-reservoir load cell assemblies of FIGS. 5A–5B or 11A–11B.

The third embodiment operates like the second embodiment except the load cell 512 only measures the volume of chemical in the main reservoir task 506 as shown in FIGS. 5A–5B and 6. The advantage of the third embodiment is the precise amount of chemical brought into the main reservoir 506 is always known and the PLC does not have to infer the amount of chemical that was removed from the buffer reservoir 508 during a refill operation. The third embodiment can be used in the system of FIG. 6 with the control system (i.e., PLC, A/D, signal amplifier, etc.) of FIG. 3. Note, in the application, the lead digit of the part numbers generally indicates which drawing shows the details of the part, while the tailing digits indicate that the part is like other parts with the same trailing digits. Thus, the buffer reservoir 206 and the buffer reservoir 306 are similar in function, and found in FIG. 2A and FIG. 3A, respectively.

Figures 7A, 7B:
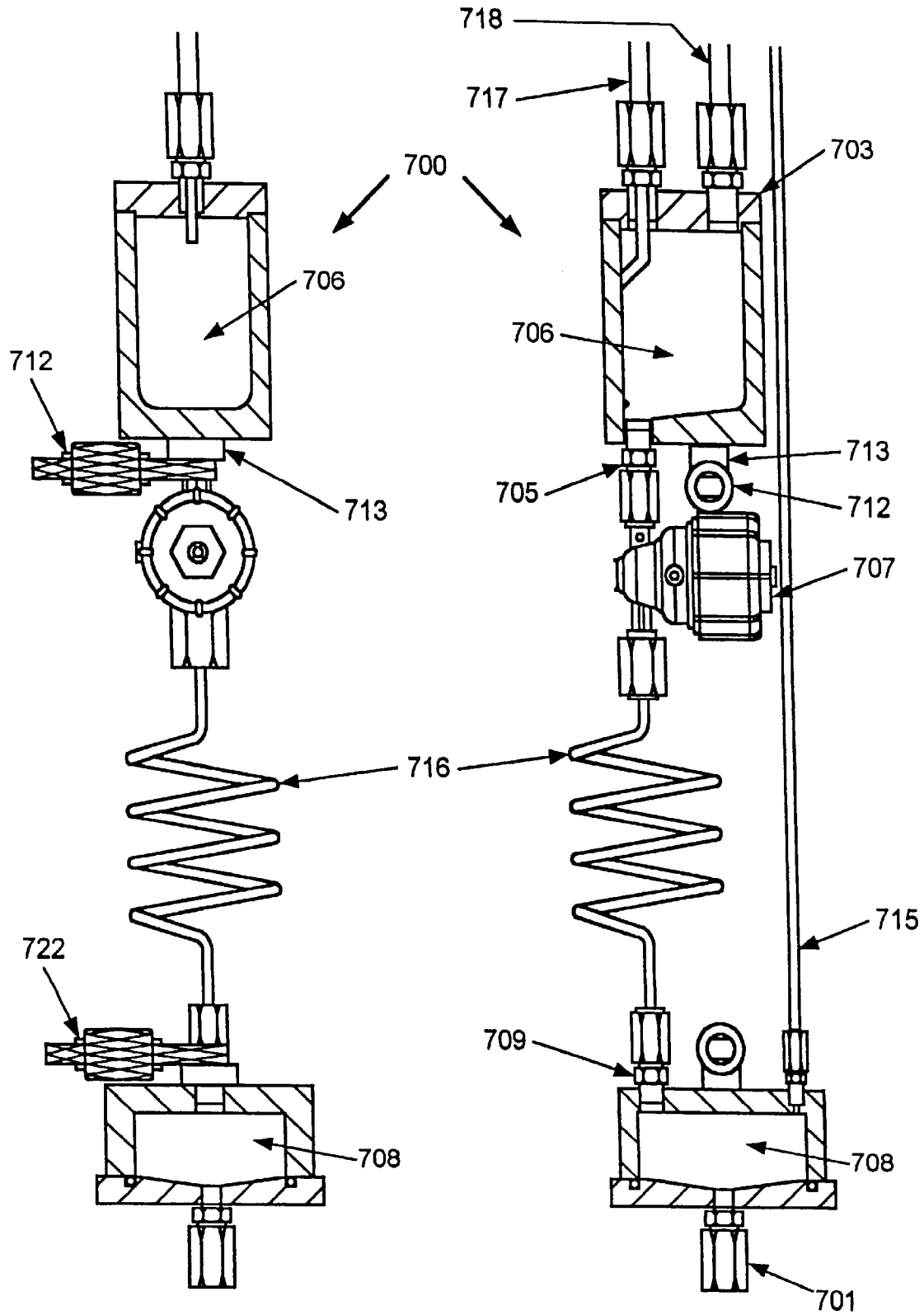
FIG. 7A is a front cross-section of a fourth embodiment of the multi-reservoir load cell assembly.
FIG. 7B is a side cross-section of the fourth embodiment of the multi-reservoir load cell assembly.
Figure 8:
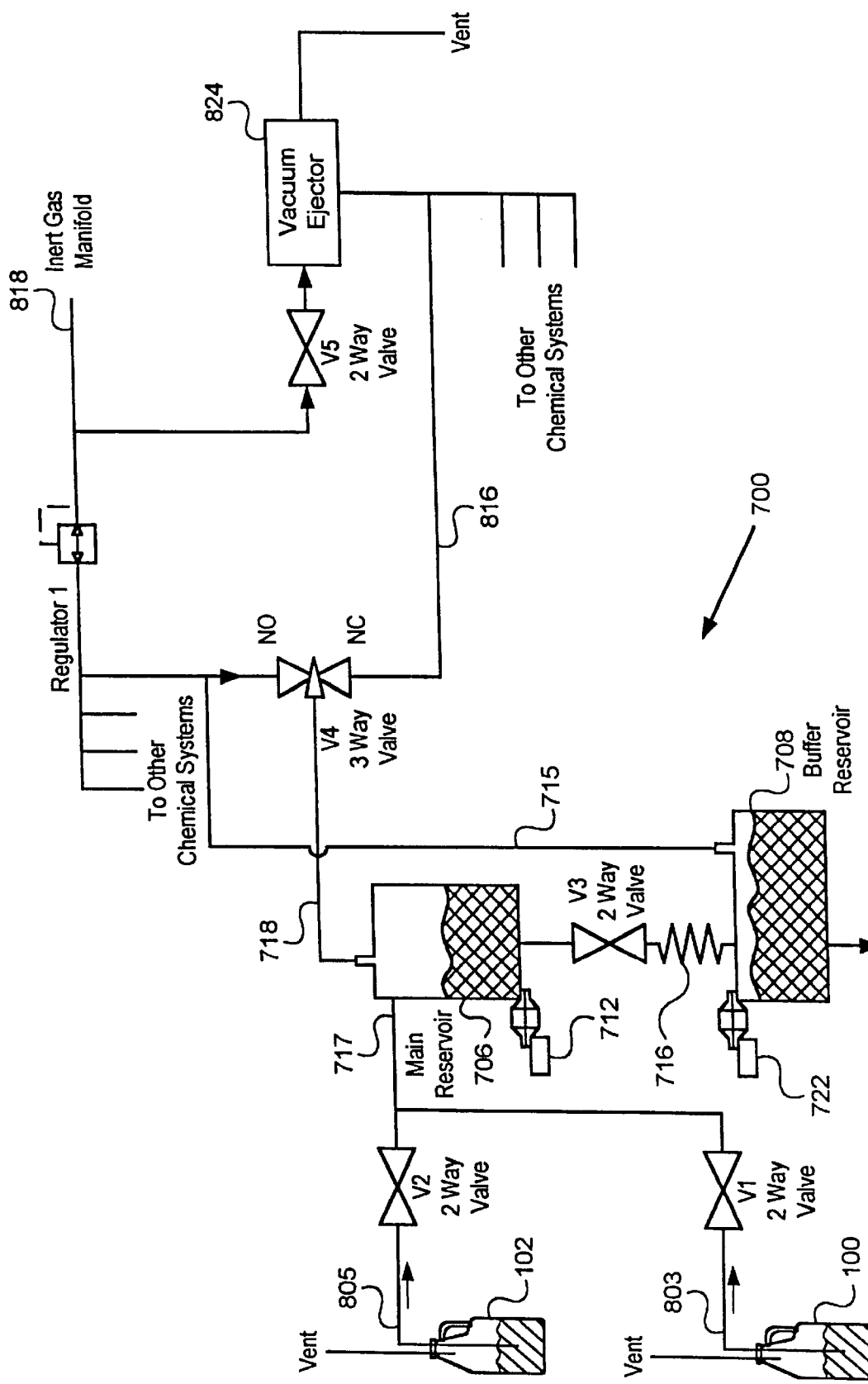
FIG. 8, a piping and instrument diagram, illustrates an embodiment of the chemical delivery system including the multi-reservoir load cell assembly of FIGS. 7A–7B.

A fourth embodiment of the multi-reservoir load cell assembly 700 shown in FIGS. 7A–7B, employs the same components as the third embodiment, however, a second load cell 722 is attached to the buffer reservoir 708. The assembly 700 is preferably used with the system of FIG. 8 with the control system of FIG. 3 with additional components for the second load cell.

The fourth embodiment of the multi-reservoir load cell assembly 700 shown in FIGS. 7A–7B, operates much like the second embodiment except that the load cell 712 only measures the chemical in the main reservoir 706 and the load cell 722 only measures the chemical in the buffer reservoir 708. The advantage here is the buffer reservoir 708 is constantly monitored so if the downstream process or tool suddenly consumes large amounts of chemical during a refill cycle, the system can stop the refill cycle short to bring chemical into the buffer reservoir 708 from the main reservoir 706 to prevent the complete evacuation of chemical from the buffer reservoir 708.

Figures 9A, 9B:
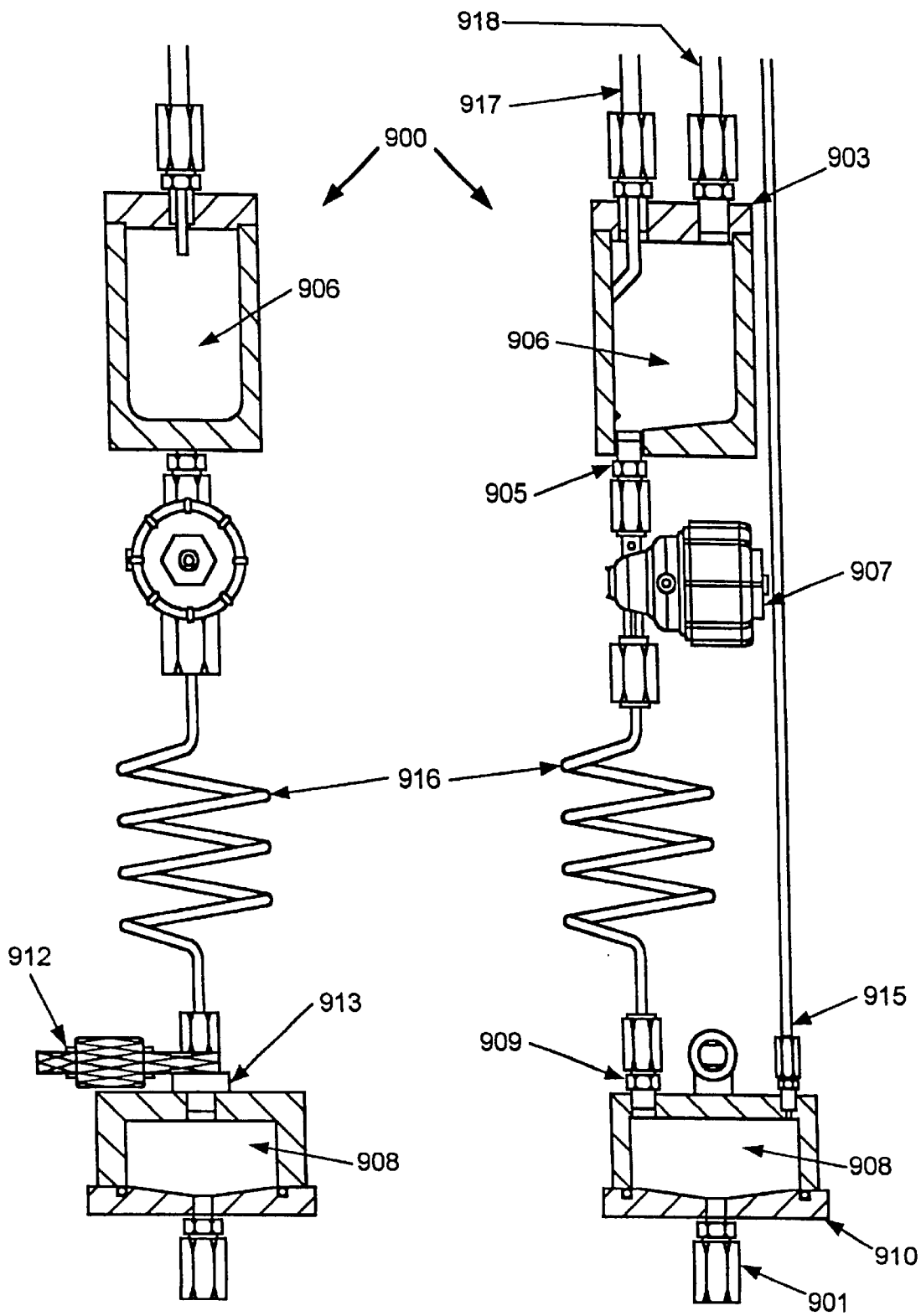
FIG. 9A is a front cross-section of a fifth embodiment of the multi-reservoir load cell assembly.
FIG. 9B is a side cross-section of the fifth embodiment of the multi-reservoir load cell assembly.
Figure 10:
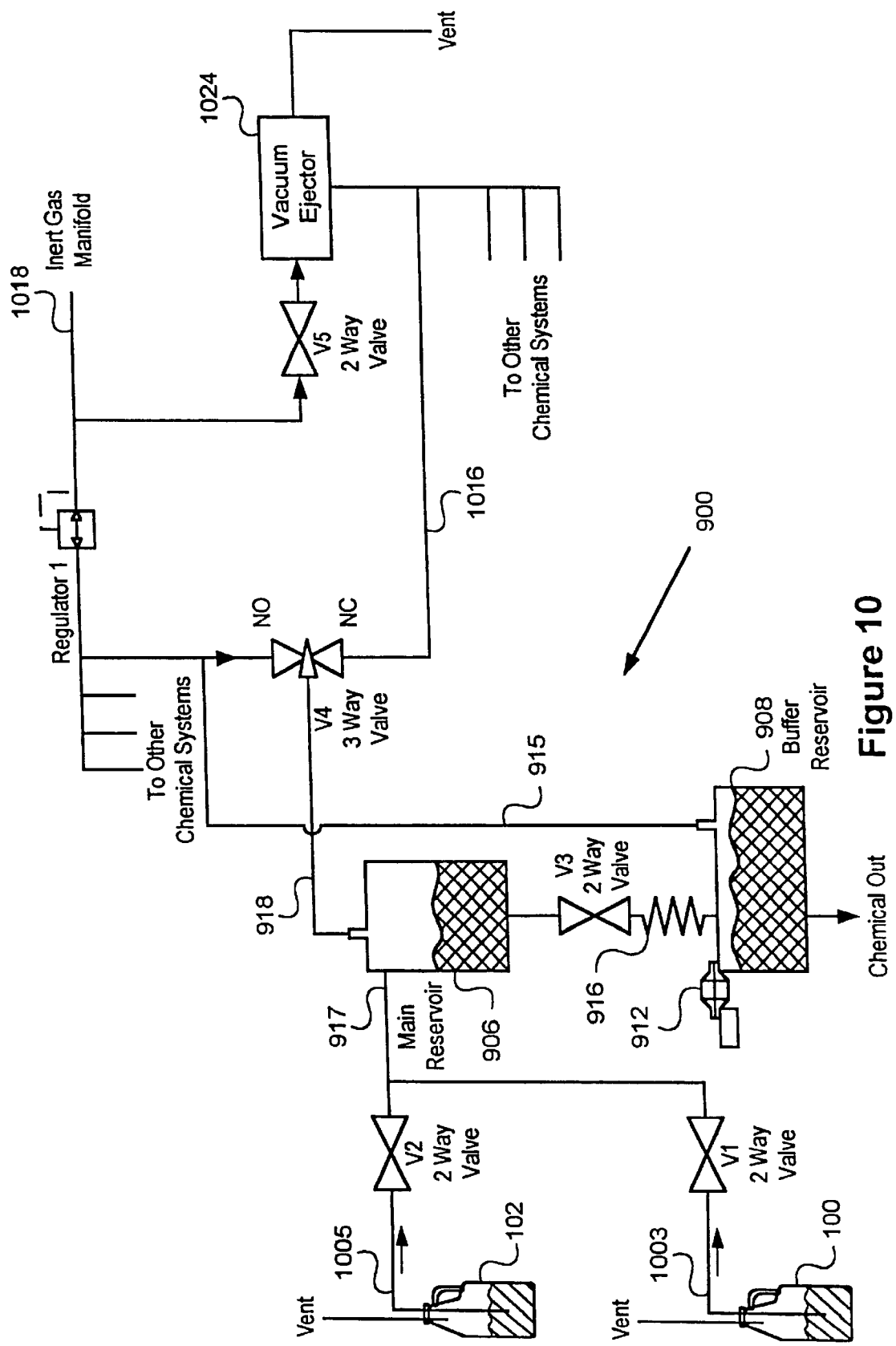
FIG. 10, a piping and instrument diagram, illustrates an embodiment of the chemical delivery system including the multi-reservoir load cell assembly of FIGS. 9A–9B.

A fifth embodiment of the multi-reservoir load cell assembly 900 shown in FIGS. 9A–9B uses the same components as the third embodiment, except the load cell 912 is attached to the buffer reservoir 908 instead of the main reservoir 906. The fifth embodiment is preferably used in the system depicted in FIG. 10 with the control system (i.e., PLC, A/D, signal amplifier, etc.) shown in FIG. 3.

Functionally, the fifth embodiment of the multi-reservoir load cell assembly 900 operates the same as the second embodiment, the only difference is the load cell 912 only weighs the chemical in the buffer reservoir 908.

As the process or tool consumes the chemical, the weight of the buffer reservoir 908 remains constant until the main reservoir 906 also becomes empty. Then the weight in the buffer reservoir 908 will start to decrease, indicating that the main reservoir 906 needs to be refilled. At this point the main reservoir 906 is refilled for a calculated period of time. During this sequence the buffer reservoir 908 decreases until the main reservoir 906 has been refilled and the valve 907 has been reopened between the two reservoirs 906, 908.

A sixth embodiment uses the same components of third embodiment shown in FIGS. 5A–5B. The only notable difference is that the inert gas blanket (see FIG. 6) of approximately one psi is increased to approximately 80 psi (more or less depending on the type of chemical). The increased inert gas pressure enables the sixth embodiment to pressure dispense the chemical at a constant output pressure which remains unaffected even during the refill cycle. This method would allow very precise non-pulsed output flow of the chemical. This may be a highly critical feature in an ultra high purity application that pumps the chemical through a filter bank. Any pulsation of the chemical can cause particles to be dislodged from the filter bank into the ultra-pure chemical output flow.

Figures 11A, 11B:
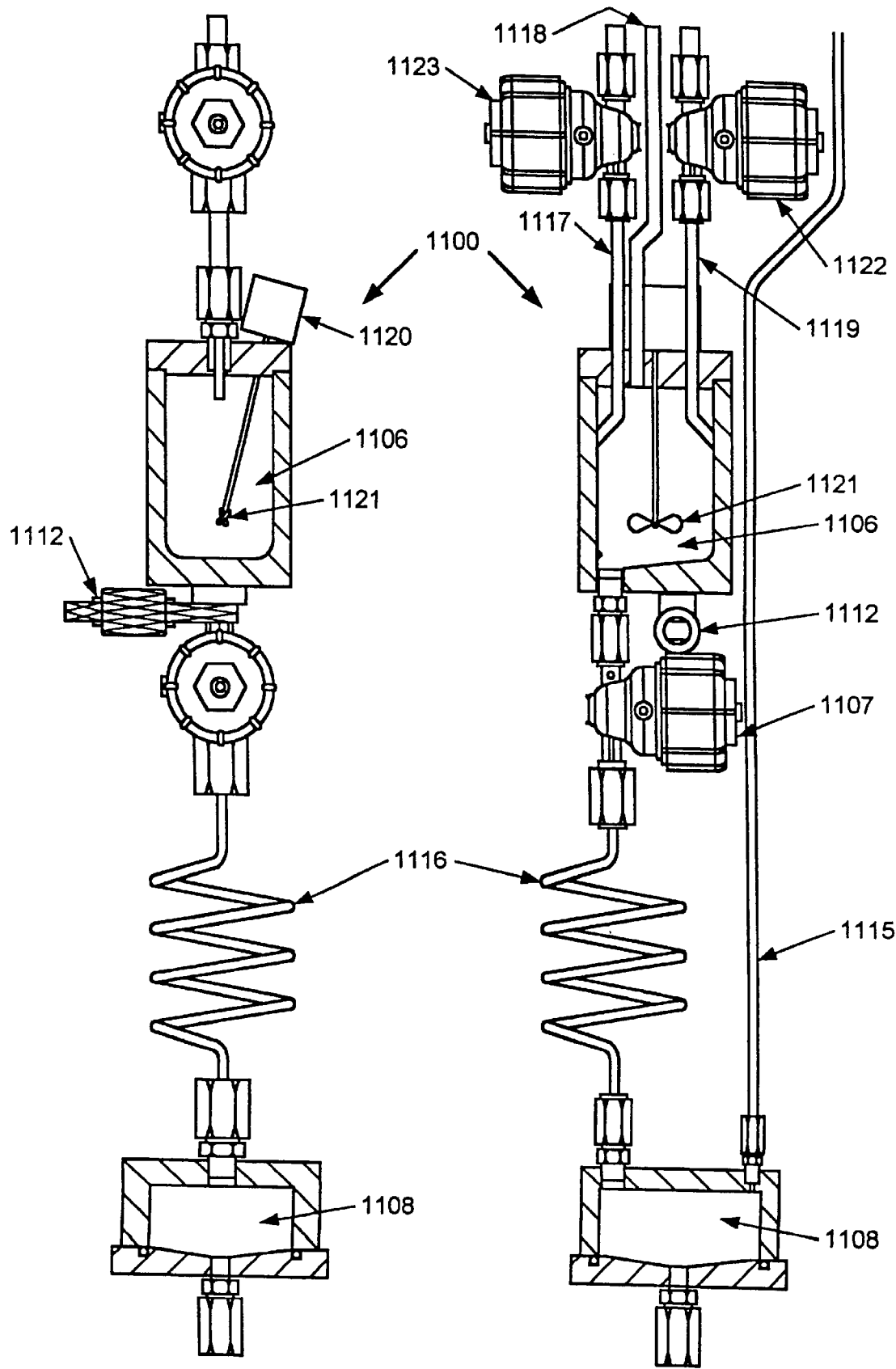
FIG. 11A is a front cross-section of a seventh embodiment of the multi-reservoir load cell assembly.
FIG. 11B is a side cross-section of the seventh embodiment of the multi-reservoir load cell assembly.

A seventh embodiment uses the same components as the third embodiment with additional components shown in FIGS. 11A–11B, including a main reservoir 1106, a buffer reservoir 1108, a second chemical input line 1119 added to the main reservoir 1106 through the valve 1122, a valve 1123 added to the chemical input line 1117, and a stir motor 1120 and an impeller assembly 1121.

Functionally, the seventh embodiment operates the same as the third embodiment with the added capability of mixing two chemicals in precise proportions before transferring the mixture to the buffer reservoir 1108. The chemical can be drawn into the main reservoir 1106 through open valve 1123 and the chemical input line 1117 and weighed by the load cell 1112. When the proper amount has been drawn into the main reservoir 1106, the valve 1123 is closed and the valve 1122 is opened to allow the second chemical to enter the mm reservoir 1106. When the proper amount has been drawn into the main reservoir 1106, the valve 1122 is closed and the chemicals are blended via the stir motor 1120 and impeller assembly 1121. The stirring of the chemicals can be initiated at any time during the above sequence. Once the mixing is complete, the valve 1107 opens to allow the chemical to transfer to the buffer reservoir 1108, which is also connected to gas line 1115. This is an ideal way to mix time sensitive chemistries and maintain a constant, non-pulsed output of the blended chemicals.

In review, the present invention provides at least the following benefits. The output chemical can be maintained at a constant pressure. A track tool never experiences a low pressure chemical line that could prevent a dispense sequence from occurring, therefore the yield of the track tool is increased. A multitude of containers and sizes can be connected to the reservoir system as chemical supply containers. If the fluid volume of the supply containers are known before they are connected, the computer can calculate very accurately the amount of chemical that has been removed from the container and therefore present the information to a display for a visual, real time indication of the remaining amount of chemical. The graphical interface communicates to the operator at a "glance" the condition of the supply containers. The load cells can determine when the supply container is completely empty since there will not be a continued weight increase during a refill sequence. This indicates the supply container is empty and that another container should be brought on line. In one embodiment, data logging of chemical usage can be provided since the chemical in the reservoir(s) is continuously and accurately weighed by load cell(s) which give an input signal to the PLC or other logic device which outputs real time, accurate information as to the amount of chemical available in the reservoir. The load cell is an inherently safe sensing device since failure is indicated by an abnormally large reading or an immediate zero reading, both of which cause the PLC or other logic device to trigger an alarm. The invention can also prevent bubbles that occur during a supply container switching operation from passing through to the output chemical line, can provide constant, non-varying pressure dispense with multiple supply containers, can refill itself by vacuum or by pumping liquid to refill the reservoir or refill with different chemicals at precise ratios and mix them before transferring the mixture to the buffer reservoir, which may be important for time dependent, very reactive chemistries.

What is claimed:

1. A system for mixing a first liquid chemical with a second liquid chemical, comprising:

a main reservoir associated with a first liquid chemical valve, a second liquid chemical valve, a liquid chemical output valve, a gas input valve, a load cell generating a first signal indicating the amount of first liquid chemical in the main reservoir and generating a second signal indicating the amount of the second liquid chemical in the main reservoir, and a mixer assembly; and a controller, coupled to the load cell, the first liquid chemical valve, the second liquid chemical valve, the liquid chemical output valve, and the gas input valve, wherein the controller actuates the first liquid chemical valve to supply the first liquid chemical to the main reservoir in accordance with the first signal, the second liquid chemical valve to supply the second liquid chemical to the main reservoir in accordance with the second signal, the gas input valve to supply pressurized gas to the main reservoir, the mixer assembly to mix the first liquid chemical and/or the second liquid chemical, and the liquid chemical output valve to deliver the liquid chemical(s) resulting from the first and second liquid chemicals mixing in the main reservoir.

2. A system for mixing a plurality of liquid chemicals, comprising:

a main reservoir with a load cell, a plurality of liquid chemical input valves, a liquid chemical output valve, a gas input valve, a mixer assembly, wherein the load cell generates signals indicating the weight of each of the plurality of liquid chemicals in the main reservoir; and a controller, coupled to the load cell, the plurality of liquid chemical input valves, the liquid chemical output valve, the gas input valve, and the mixer assembly, wherein the controller adjusts the plurality of liquid chemical input valves to admit the plurality of liquid chemicals to the main reservoir, actuates the gas input valve to supply pressurized gas to the main reservoir, actuates the mixer assembly to mix the plurality of liquid chemicals, and adjusts the liquid chemical output valve to transfer the liquid chemical(s) derived from mixing the plurality of liquid chemicals from the main reservoir.

3. A liquid chemical delivery system, comprising:

a main reservoir with a first liquid chemical valve, a second liquid chemical valve, a liquid chemical output valve, a gas input valve, and a load cell generating a first signal indicating the amount of first liquid chemical in the main reservoir and a second signal indicating the amount of the second liquid chemical in the main reservoir; and a controller, coupled to the first liquid chemical valve, the second liquid chemical valve, the liquid chemical output valve, the gas input valve, and the load cell, wherein the controller actuates the first liquid chemical valve to supply the first liquid chemical and the second liquid chemical valve to supply the second liquid chemical to the main reservoir in accordance with the first and second signals, respectively, the gas input valve to supply pressurized gas to the main reservoir, and actuates the liquid chemical output valve to deliver the liquid chemical(s) resulting from interacting the first and second liquid chemicals.

4. A liquid chemical delivery system, comprising:

a main reservoir with a load cell, a plurality of liquid chemical input valves, a liquid chemical output valve, a gas input valve, wherein the load cell generates signals indicating the weight of each of the plurality of liquid chemicals in the main reservoir; and a controller, coupled to the load cell, the plurality of liquid chemical input valves, the liquid chemical output valve, the gas input valve, wherein the controller adjusts the plurality of liquid chemical input valves to admit the plurality of liquid chemicals to the main reservoir, adjusts the gas input valve to supply pressurized gas to the main reservoir, actuates the mixer assembly to mix the plurality of liquid chemicals, and adjusts the liquid chemical output valve to transfer the liquid chemical(s) derived from interaction of the plurality of liquid chemicals from the main reservoir.

* * * * *

UNITED STATES PATENT AND TRADEMARK OFFICE
CERTIFICATE OF CORRECTION

PATENT NO. : 6,675,987 B2  Page 1 of 1
DATED : January 13, 2004
INVENTOR(S) : Randy Forshey and David Soberanis It is certified that error appears in the above-identified patent and that said Letters Patent is hereby corrected as shown below:

Title page,
Item [75], Inventors, "David Soberunie, Tracy, CA (US); Randy Forshey, Tracy, CA (US)" should read -- Randy Forshey, Tracy, CA (US); David Soberanis, Tracy, CA (US) --
Item [56], References Cited, FOREIGN PATENT DOCUMENTS, insert
-- EP 98309557.1
 EP 0516573 A --

Column 1,
Line 48, "acts" should read -- cuts --

Column 2,
Line 8, "detect" should read -- detects --
Line 55, "relate" should read -- relates --

Column 5,
Line 41, "thruway" should read -- three-way --
Line 67, "system" should read -- system, --

Column 7,
Line 1, "tailing" should read -- trailing --

Signed and Sealed this

Twenty-eighth Day of December, 2004

JON W. DUDAS
*Director of the United States Patent and Trademark Office*